(12) United States Patent
van Sinderen et al.

(10) Patent No.: US 9,413,407 B2
(45) Date of Patent: Aug. 9, 2016

(54) CONVERSION SYSTEM

(75) Inventors: Jan van Sinderen, Liempde (NL);
Johannes Hubertus Antonius Brekelmans, Niederweert (NL); Frank Harald Erich Ho Chung Leong, Eindhoven (NL); Nenad Pavlovic, Eindhoven (NL)

(73) Assignee: NXP B.V., Eindhoven (NL)

( * ) Notice: Subject to any disclaimer, the term of this patent is extended or adjusted under 35 U.S.C. 154(b) by 691 days.

(21) Appl. No.: 13/178,559

(22) Filed: Jul. 8, 2011

(65) Prior Publication Data
US 2012/0008717 A1   Jan. 12, 2012

(30) Foreign Application Priority Data

Jul. 12, 2010  (EP) ..................................... 10251241

(51) Int. Cl.
*H03D 3/22* (2006.01)
*H04B 1/30* (2006.01)
*H03D 7/16* (2006.01)

(52) U.S. Cl.
CPC .. *H04B 1/30* (2013.01); *H03D 7/16* (2013.01); *H03D 7/165* (2013.01)

(58) Field of Classification Search
CPC ........... H03D 7/165; H03D 7/16; H04B 1/30; H03F 1/3247
USPC ............. 375/332, 297, 351, 350; 342/357.06; 327/356; 455/318
See application file for complete search history.

(56) References Cited

U.S. PATENT DOCUMENTS

| | | | | |
|---|---|---|---|---|
| 4,303,885 | A * | 12/1981 | Davis et al. | 324/237 |
| 6,477,360 | B1 * | 11/2002 | Watanabe et al. | 455/318 |
| 6,515,542 | B1 * | 2/2003 | Wang et al. | 330/69 |
| 7,002,370 | B1 * | 2/2006 | Metzgen et al. | 326/41 |
| 7,636,007 | B2 * | 12/2009 | Wakayama et al. | 327/408 |
| 7,830,456 | B1 * | 11/2010 | Vysyaraju et al. | 348/725 |
| 8,138,817 | B2 * | 3/2012 | Brekelmans et al. | 327/355 |
| 8,280,333 | B2 | 10/2012 | Van Sinderen et al. | |
| 8,374,570 | B2 * | 2/2013 | Seendripu et al. | 455/317 |
| 8,406,358 | B1 * | 3/2013 | Uehara et al. | 375/350 |
| 2002/0163386 | A1 * | 11/2002 | Ide et al. | 330/296 |
| 2005/0239430 | A1 * | 10/2005 | Shah | 455/326 |
| 2006/0135108 | A1 * | 6/2006 | De Ranter et al. | 455/313 |

(Continued)

OTHER PUBLICATIONS

Ru, Zhiyu., et al; "On the Suitability of Discrete-Time Receivers for Software-Defined Radio"; IEEE International Symposium on Circuits and Systems, 2007, New Orleans, LA, USA; pp. 2522-2525 (May 30, 2007).

(Continued)

*Primary Examiner* — Shuwang Liu
*Assistant Examiner* — Helene Tayong

(57) ABSTRACT

The invention relates to frequency conversion systems, in particular for use as up-converters or down-converters in radiofrequency (RF) receivers or transmitters, exemplary embodiments including a radiofrequency receiver including an RF signal input; a mixing module including a first plurality of IF amplifiers each connected to the RF signal input via a switch; a multi-phase local oscillator signal generator configured to provide a switching signal to each switch; and a summing module configured to receive output signals from each of the IF amplifiers and to provide a second plurality of output IF signals from a weighted sum of the IF amplifier output signals, wherein the second plurality is different to the first plurality.

12 Claims, 8 Drawing Sheets

(56) References Cited

U.S. PATENT DOCUMENTS

| | | |
|---|---|---|
| 2007/0026835 A1 | 2/2007 | Yamaji et al. |
| 2007/0096980 A1* | 5/2007 | Gradincic et al. ....... 342/357.06 |
| 2010/0112971 A1 | 5/2010 | Matsuno et al. |
| 2010/0156502 A1* | 6/2010 | Van Zeijl et al. ............. 327/356 |
| 2011/0124309 A1* | 5/2011 | Trotta et al. .................. 455/326 |
| 2011/0222633 A1* | 9/2011 | Pullela et al. ................. 375/318 |
| 2011/0291732 A1 | 12/2011 | Nenad et al. |

OTHER PUBLICATIONS

Extended European Search Report for application EP 2 408 118 A1 (Jan. 25, 2011).

* cited by examiner

CONVERSION SYSTEM

CROSS-REFERENCE TO RELATED APPLICATIONS

This application claims the priority under 35 U.S.C. §119 of European patent application no. 10251241.5, filed on Jul. 12, 2010, the contents of which are incorporated by reference herein.

The invention relates to frequency conversion systems, in particular for use as up-converters or down-converters in radiofrequency (RF) receivers or transmitters.

The general configuration of a typical RF CMOS-based receiver is illustrated in FIG. 1. An RF input 101 is connected to an input attenuator 102 in the form of an adjustable π attenuator. An output of the attenuator 102 is connected to a low noise amplifier (LNA) stage 103, the output of which is provided to a further π attenuator 104. The attenuator 104 provides an RF signal to a mixer stage 105 in the form of a 25% duty cycle mixer. The mixer stage 105 comprises four switches $106_{1-4}$ controlling the input signals to four corresponding transimpedance amplifiers $107_{1-4}$. Outputs of the transimpedance amplifiers (TIAs) are provided to an analogue to digital converter stage 108, in the form of multiple Sigma-Delta (SD) analogue to digital converters (ADCs).

A number of local oscillator (LO) signals at different relative phases are needed for driving the switches $106_{1-4}$ of the mixer stage 105. The mixer switches should not be turned on simultaneously as this would boost the noise of the TIAs $107_{1-4}$.

A typical circuit for generating the required 25% duty-cycle LO signals is illustrated in FIG. 2. The signal generated by an LC oscillator, 2LO_N and 2LO_P, is frequency divided by two by first and second data flip-flops 201, 202. The Q and Qb outputs of the flip-flops 201, 202 are provided to series pairs of NOT gates $203_{1-4}$, to provide signals Lo_I+, LO_O+, LO_I−, LO_Q−. These signals are provided, in combination with the positive and negative versions of the local oscillator signal 2LO_P, 2LO_N to AND gates $204_{1-4}$, to provide output local oscillator signals in quadrature. The resulting output signals are thereby re-clocked so that the timing of the resulting edges are accurate, resulting in low jitter and a low quadrature error.

Programmable dividers can be placed between a tunable LC oscillator and the 25% duty-cycle generation block to downwardly extend the tuning range of the frequency converter. A large tuning range is thus obtained from an LC oscillator with relatively small tuning range. For example a programmable divider can be used having the divider ratios of 2, 3, 4, 5, etc, which can provide a 50% duty-cycle signal with edges triggered by the edges of the LC oscillator signal for low noise (jitter) and low power consumption. If for example a tuning range of 50 MHz to 1 GHz needs to be realized, the maximum required LC oscillator frequency will be 4 GHz and the minimum LC oscillator frequency will be 2.667 GHz (3.266 GHz+22.4%/−18.4%).

With above described technique the possible ratios between oscillator frequency and LO frequency (offered to the mixer) is in multiples of 2, i.e. 2, 4, 6, 8, 10, 12, etc. The multiples of 2 result from the need to generate a complex LO signal, i.e. a 4 phase LO signal, from the frequency divided LC oscillator signal. To widen this tuning range through the use of programmable dividers, the required oscillator tuning range will be $f_{max}/f_{min}=(div_{min}+2)/div_{min}$, where $div_{min}$ is the minimum divider ratio. A larger minimum divider ratio will reduce the required oscillator tuning range, but this increases the nominal oscillator frequency.

Covering a large RF frequency range requires a large tuning range for the oscillator that drives the down-conversion mixer. This may require the use of multiple LC oscillators, what takes quite some silicon area. Secondly the implementation of 2 or more independent tuners on a single die will create oscillator pulling problems (spurs) if the multiple oscillators are using about the same frequency. Therefore it is required that the multiple tuners use oscillators with non-overlapping frequency tuning ranges. This is only possible if the required oscillator tuning range is sufficiently small.

It would be advantageous to have a smaller tuning range without increasing the nominal oscillator frequency, because a higher oscillator frequency would either increase power consumption or may not be feasible given current integrated circuit technology.

Existing techniques may use fractional dividers capable of dividing by 1.5, 2.5 etc.

Such fractional dividers have several disadvantages, arising from the non-50% native output duty cycle and the need to interpolate a missing clock edge. For example, frequency divider additional circuitry may be applied to correct non-50% duty-cycle output signals to an accurate 50% duty-cycle. Currently known circuitry tends to be relatively noisy, with high phase noise and jitter, as well as requiring more power.

It is an object of the invention to address one or more of the above mentioned problems.

In accordance with a first aspect of the invention there is provided a radiofrequency receiver comprising:
  an RF signal input;
  a first plurality of IF amplifiers each connected to the RF signal input via a switch;
  a multi-phase local oscillator signal generator configured to provide a switching signal to each switch; and
  a summing module configured to receive output signals from each of the IF amplifiers and to provide a second plurality of output IF signals from a weighted sum of the IF amplifier output signals,
  wherein the second plurality is different to the first plurality.

The summing module may comprise a summing amplifier for each of the second plurality of output IF signals, each summing amplifier connected to one or more of the IF amplifiers via a weighted resistor network. Alternatively, the summing module may comprise a plurality of analogue to digital converters configured to receive the output signals from the first plurality of IF amplifiers and a digital summing module configured to provide the second plurality of IF signals from a weighted sum of outputs from the plurality of analogue to digital converters.

The summing module may be configured to provide a quadrature IF signal, or could be configured to provide an IF signal having greater or fewer than four outputs.

The second plurality may be greater than or less than the first plurality.

In accordance with a second aspect of the invention there is provided a radiofrequency transmitter comprising:
  an IF signal input;
  a summing module configured to receive a first plurality of IF input signals from the IF signal input and provide a second plurality of output IF signals from a weighted sum of the IF input signals
  a first plurality of IF amplifiers each connected to the summing module via a switch to receive one of the second plurality of output IF signals;
  a multi-phase local oscillator signal generator configured to provide a switching signal to each switch; and an RF amplifier configured to receive RF signals from the plurality of IF amplifiers and provide a combined signal to an RF output, wherein the second plurality is different to the first plurality.

The first plurality of IF signals may comprise quadrature IF signals.

The second plurality may be an odd integer greater than or equal to three.

Exemplary embodiments according to the invention are described in further detail below, with reference to the accompanying drawings in which.

Figure 1:
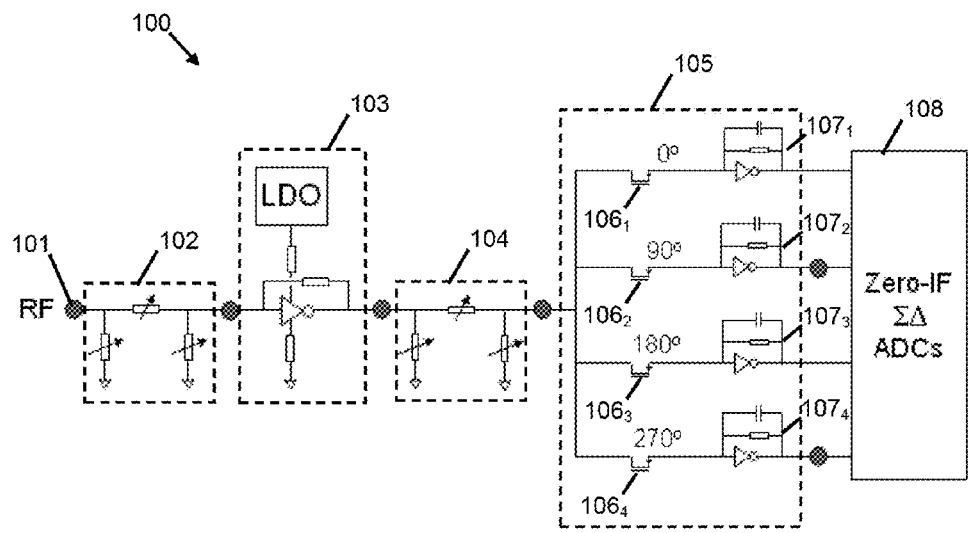
FIG. 1 is a schematic diagram of an RF CMOS receiver.
Figure 2:
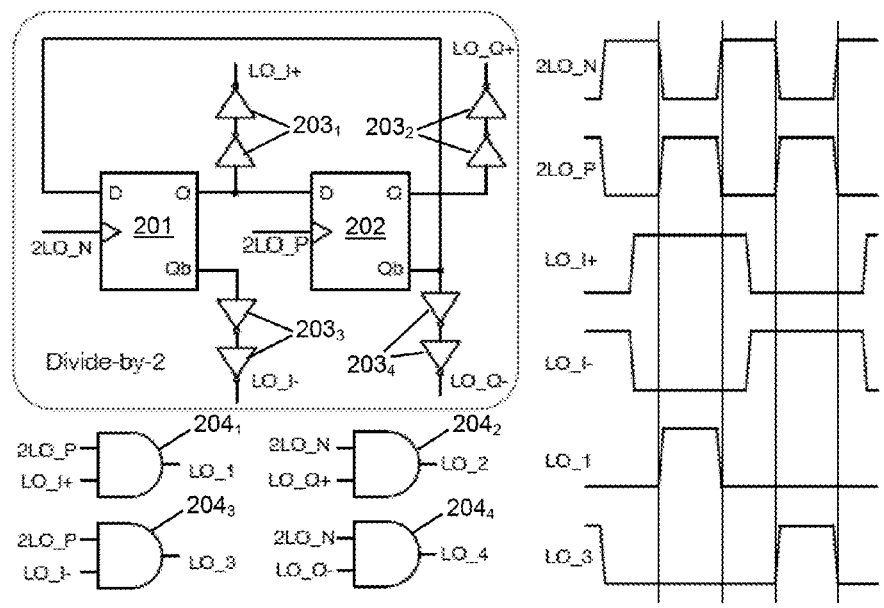
FIG. 2 is a schematic diagram of a 25% duty cycle generation circuit and corresponding waveforms.

As shown in FIG. 2, local oscillator signals provided by a common local oscillator signal generator comprise multiple phases that are non-overlapping, the edges of these signals being triggered by the edges of the common local oscillator signal. The number of switches in a mixer such as shown in FIG. 1 is equal to the number of generated phases. Where four phases are generated, as described above, a balanced quadrature IF signal results. If other numbers of phases are used, the mixer IF output signals will not be in quadrature, for example if 3, 5, 6 or 7 LO phases are used. However, as described in further detail below, it is possible to recombine the mixer IF output signals such that the resulting signal is again a quadrature signal.

By applying the proposed technique in a reconfigurable manner, the possible ratios between oscillator frequency and LO frequency (offered to the mixer) can be 1.5, 2, 2.5, 3, 3.5, etc. In the case of a wider LO tuning range, which can be extended by programmable integer dividers, the required tuning range $f_{max}/f_{min}=(div_{min}+0.5)/div_{min}$, where $div_{min}$ is the minimum divider ratio.

The above example with an maximum oscillator frequency of 4 GHz requires a minimum oscillator frequency of 3.55 GHz (3.78 GHz+/−6%), with $div_{min}=4$.

Since there can be a trade-off between the power consumption needed for generating and processing the number of phases and the tuning range in the VCO, it can be advantageous to use a higher frequency VCO (as a result of a Q-factor versus frequency) followed by a fixed divider. The fixed divider can then be followed by programmable dividers that are a power of 2, followed by fractional dividers 2, 2.5, 3, 3.5 that drive the mixer with multiple phases.

Figure 3:
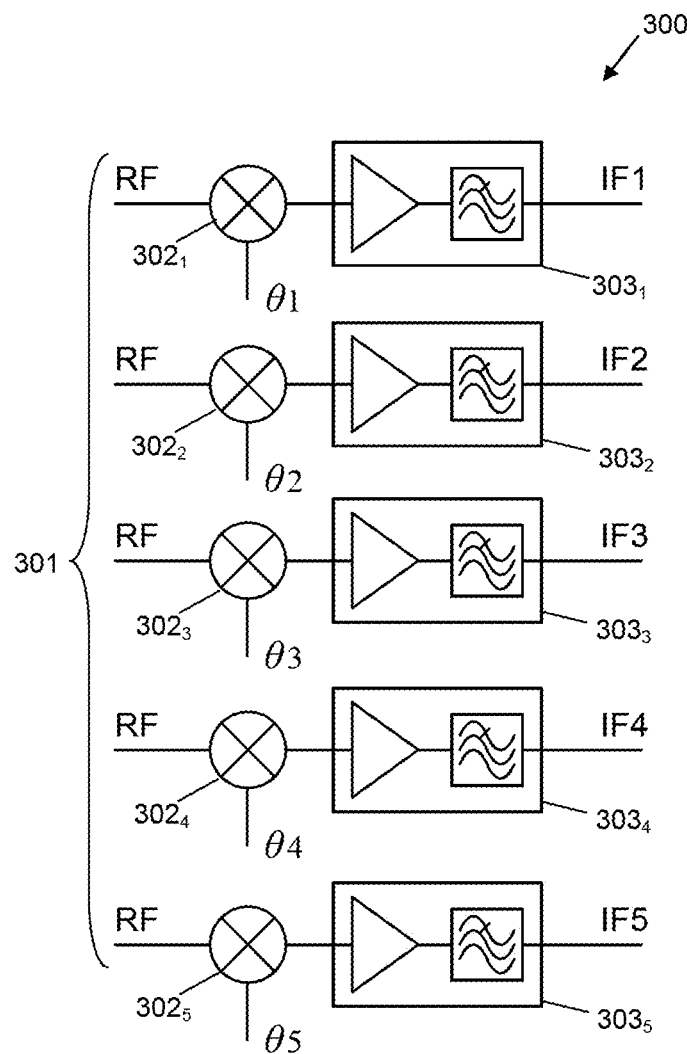
FIG. 3 is a schematic diagram of a multiphase down-converter comprising five IF mixers.

An example of a down-converter 300 with a reconfigurable mixer for generating IF signals at 3, 4 or 5 phases is illustrated in FIG. 3. An RF signal input 301 is connected to parallel mixers $302_{1-5}$, which each mix the RF input signal with a local oscillator signal at a different phase. Intermediate frequency signals are provided to IF amplifier/filter modules $303_{1-5}$ and output as IF signals IF1-1F5.

Figure 4:
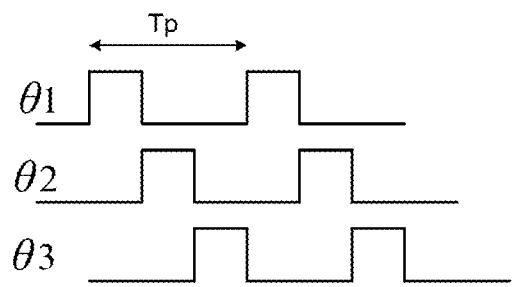
FIG. 4 is a diagram illustrating a phase relationship between local oscillator signals for a three mixer circuit.
Figure 5:
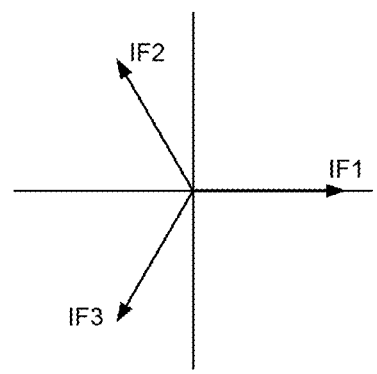
FIG. 5 is a constellation diagram of the IF signals of FIG. 4.
Figure 6:
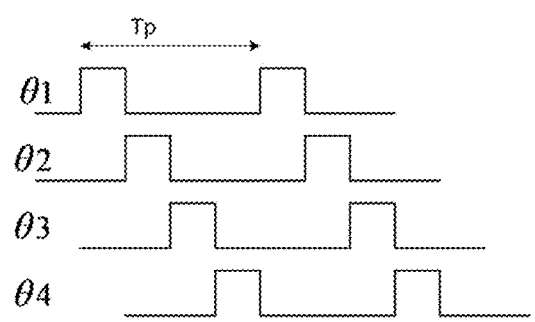
FIG. 6 is a diagram illustrating a phase relationship between local oscillator signals for a four mixer circuit.
Figure 7:
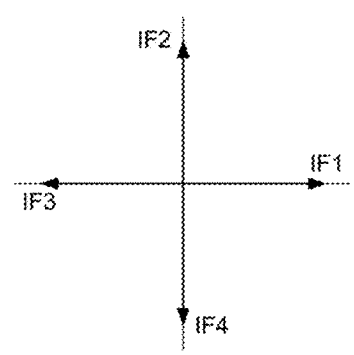
FIG. 7 is a constellation diagram of the IF signals of FIG. 6.
Figure 8:
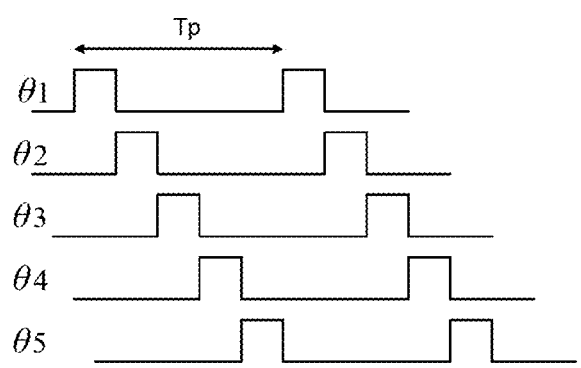
FIG. 8 is a diagram illustrating a phase relationship between local oscillator signals for a five mixer circuit.
Figure 9:
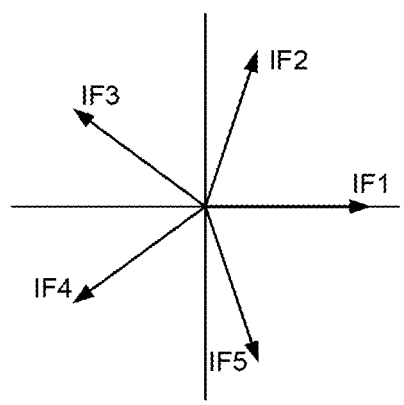
FIG. 9 is a constellation diagram of the IF signals of FIG. 8.

Exemplary local oscillator signals $\theta_1$, $\theta_2$, $\theta_3$, $\theta_4$, $\theta_5$ and their relative phase relationships are illustrated in FIGS. 4 to 9. In each case, as shown in FIGS. 4, 6 and 8, the signals have a period Tp and have equally spaced phase relationships at 120° (FIGS. 4 & 5), 90° (FIGS. 6 & 7) and 72° (FIGS. 8 & 9). In each case, the relationship between the mixer frequency $f_{mixer}$ and the clock frequency $f_{clock}$ is $f_{mixer}=f_{clock}*2/N$, where N is the number of phases.

Figure 10:
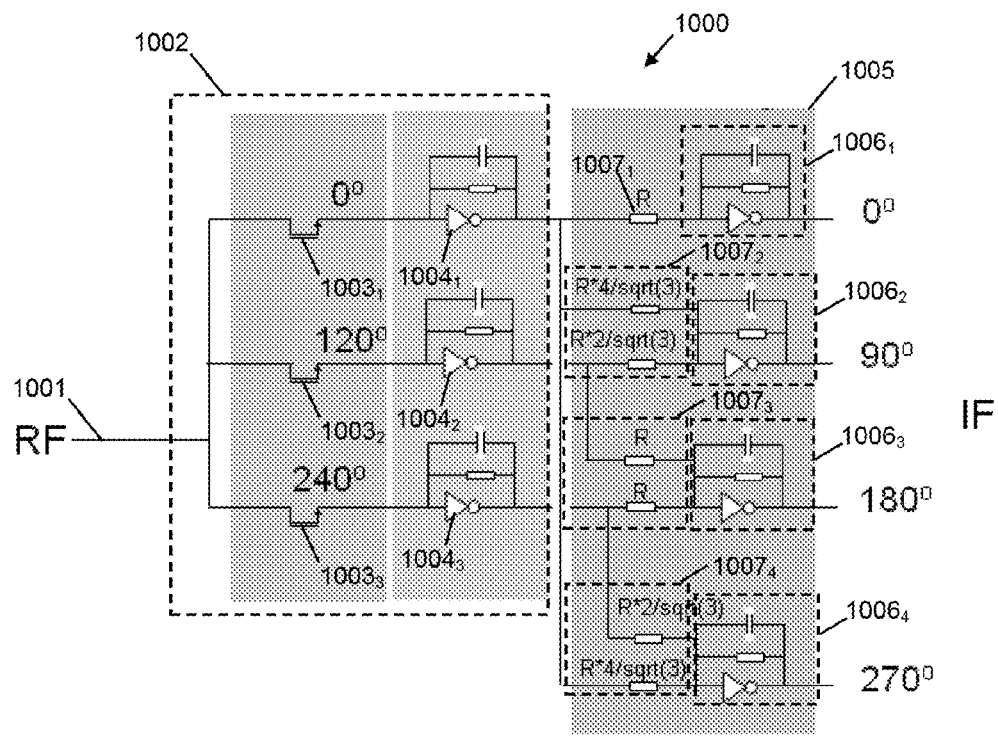
FIG. 10 is a schematic circuit diagram of an RF receiver down-converter combining a three phase mixer with a balanced quadrature (four phase) IF output.
Figure 11:
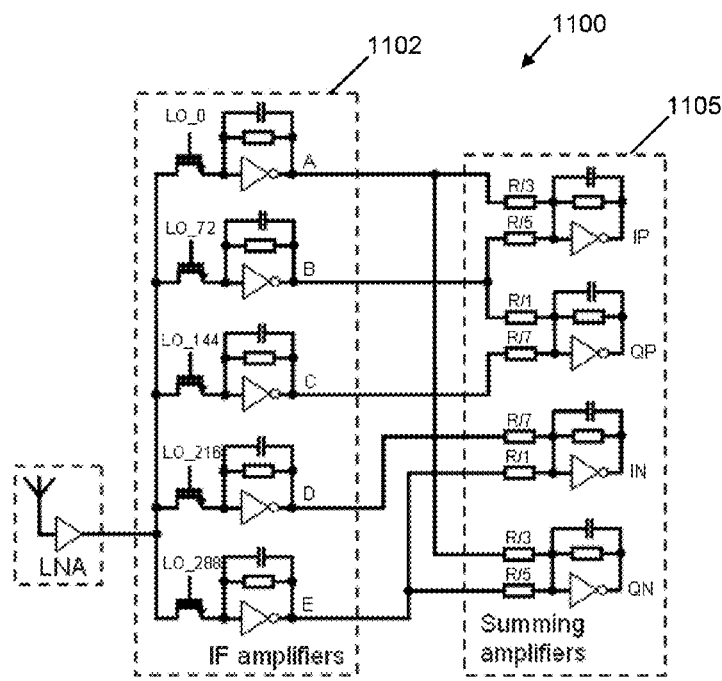
FIG. 11 is a schematic circuit diagram of an RF receiver down-converter combining a five phase mixer with a balanced quadrature IF output.

The output phases IF1-1F5 from the down-converter 300 can be recombined in order to provide balanced quadrature output signals. Illustrated in FIGS. 10 and 11 are exemplary embodiments of RF received down-converters 1000, 1100 configured to mix an input RF signal with local oscillator signal having a first plurality of phases and to output an IF signal having a second plurality of phases. In each case, the number of output phases is four, i.e. the output signal is a balanced quadrature IF signal. In the down-converter 1000 of FIG. 10, the first plurality is three, and in the down-converter 1100 of FIG. 11 the first plurality is five. Other numbers of input phases are also possible by extension. In each case the mixed IF signals are converted by summing signal currents together on the virtual ground of a second plurality of trans-impedance amplifiers. Weighting of the different phases is set by the value of resistor networks that connect the input signals towards the virtual ground of each trans-impedance amplifier, the configuration of which determines a voltage-to-current conversion.

In the down-converter 1000 illustrated in FIG. 10, an RF signal input 1001 is connected to mixer module 1002 comprising three trans-impedance amplifiers $1004_{1-3}$ arranged in parallel and connected to the RF signal input 1000 via respective switches $1003_{1-3}$. Each switch $1003_{1-3}$ is driven by a local oscillator signal at a different phase, in this case the signals being spaced at 120° intervals as in FIGS. 4 and 5. The three output signals from the mixer trans-impedance amplifiers $1003_{1-3}$ are provided to a vector conversion module in the form of a summing module 1005, comprising four summing trans-impedance amplifiers $1006_{1-4}$, each of which is connected to one or more of the mixer trans-impedance amplifiers $1003_{1-3}$ via a respective resistor network $1007_{1-4}$. The resistor network in each case determines the weighting from the outputs of each of the mixer trans-impedance amplifiers $1004_{1-3}$. The values of the resistors are shown in relative terms, i.e. all are relative to a resistor value R. The first summing trans-impedance amplifier $1006_1$ is connected via a single resistor R to the first mixer trans-impedance amplifier $1004_1$. The second summing trans-impedance amplifier $1006_2$ is connected via a resistor 4R/√3 connected to the output of the first mixer trans-impedance amplifier $1004_1$ and a resistor 2R/√3 connected to the output of the second mixer trans-impedance amplifier $1004_2$. The third summing trans-impedance amplifier $1006_3$ is connected via a resistor R connected to the output of the second mixer trans-impedance amplifier $1004_2$ and a resistor R connected to the output of the third mixer trans-impedance amplifier $1004_3$. The fourth summing trans-impedance amplifier $1006_4$ is connected via a resistor 2R/√3 connected to the output of the fourth mixer trans-impedance amplifier $1004_4$ and a resistor 4R/√3 connected to the output of the first mixer trans-impedance amplifier $1004_1$.

The alternative down-converter 1100 of FIG. 11 also provides a balanced quadrature output IF signal, but with a mixer 1102 that uses a local oscillator signal having five phases. The resistor networks in the weighted summing module 1105 are correspondingly different, but a similar principle to that described in relation to FIG. 10 applies.

The mixing module 1002 may alternatively comprise a plurality of sampling mixers, for example as described by R. Zhiyu et al., in "*On the Suitability of Discrete-Time Receivers for Software-Defined Radio*", IEEE International Symposium on Circuits and Systems, 2007, Digital Object Identifier: 10.1109/ISCAS.2007.378752, pages 2522-2525.

Figure 12:
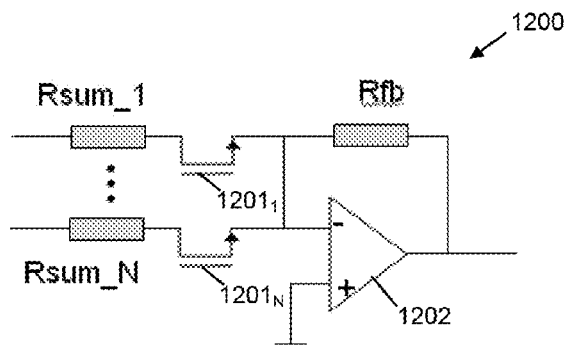
FIG. 12 is a schematic circuit diagram of a reconfigurable summing amplifier.

The weighted summing applied to each of the summing trans-impedance amplifiers can optionally be made reconfigurable by allowing the effective value of the summing resistors at the inputs of the summing amplifiers to be changed. An exemplary reconfigurable summing amplifier 1200 is illustrated in FIG. 12, in which a parallel network of resistors Rsum_1 ... Rsum_N is connected to the input of an amplifier 1202 via a network of switches $1201_1 \ldots 1201_N$. The value of a resistance connecting the amplifier 1202 can be reconfigured by applying switching signals to a combination of one or more of the switches $1201_{1-N}$, thereby allowing the summing module 1005, 1105 (FIGS. 10, 11) to be reconfigured according to a required conversion.

To improve the accuracy of the I/Q quadrature signal output, it is advantageous if the summing resistors Rsum_1 ... Rsum_N have an integer relationship with each other, as this will influence the amplitude and phase errors of the output signals of the summing amplifiers.

Figure 13:
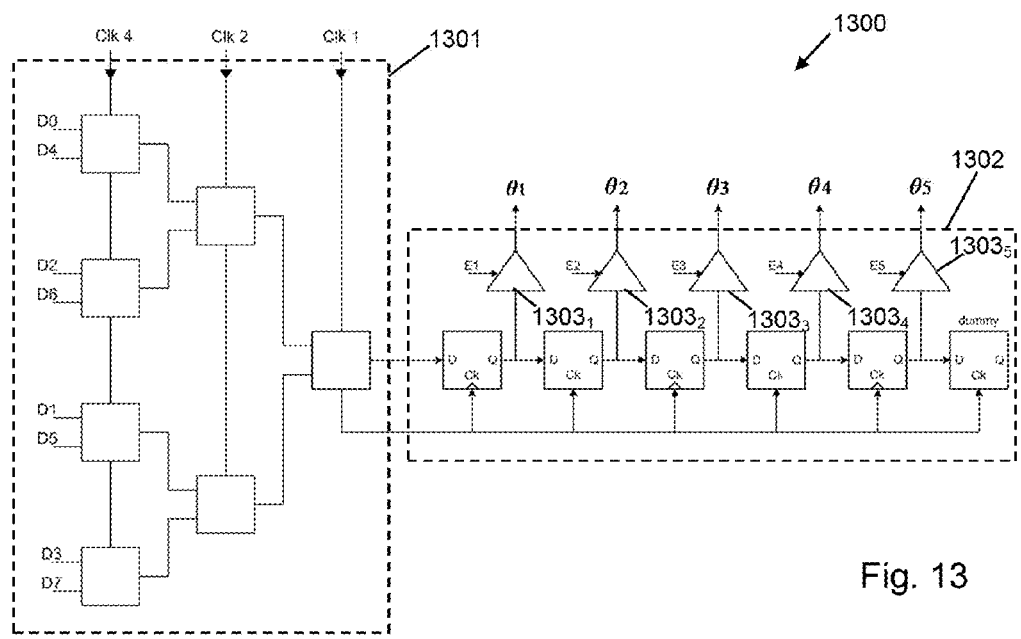
FIG. 13 is a schematic diagram of an exemplary multiphase local oscillator signal generator.

Illustrated in FIG. 13 is an exemplary embodiment of a multi-phase local oscillator signal generator 1300, in which up to five output phases can be generated. The signal generator 1300 uses an 8 to 1 multiplexer tree 1301, the output of which is connected to a 5+1 shift register 1302. By setting the input values D0 ... D7 of the multiplexer tree 1301, the LO signal outputs can reconfigured for driving 3, 4, or 5 mixer units. Unused outputs can be disabled by disabling signals E1-E5 controlling output amplifiers $1303_{1-5}$. Further details of this and other multi-phase local oscillator signal generators are provided in co-pending European application 10250980.9, the disclosure of which is hereby incorporated by reference.

In principle it is also possible to remove one or more phase paths so that sometimes all mixer switches are off. A disadvantage of this is that this will result in more LO leakage at the RF input. Therefore preferred embodiments will be configured such that at least one mixer switch is always turned on.

It is possible to convert the multiple mixer output phases to a different set of phases than balanced quadrature signals, for example three phases.

Figure 14:
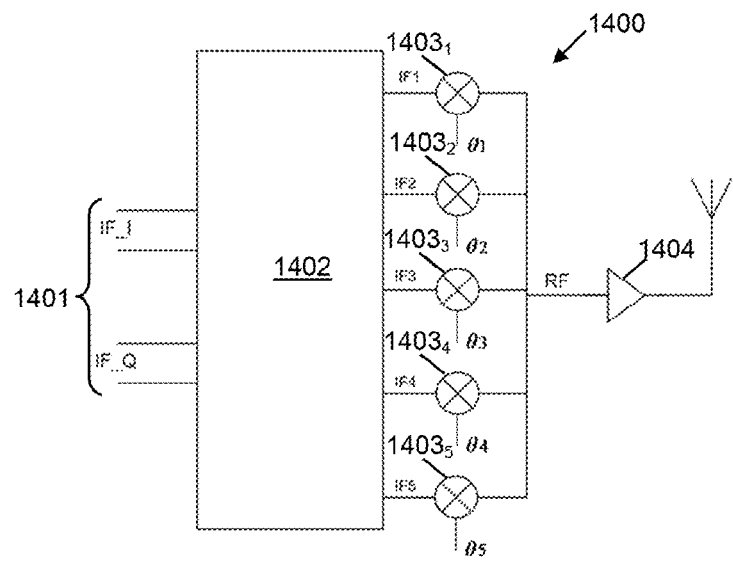
FIG. 14 is a schematic diagram of an RF up-converter combining a balanced quadrature IF input with a five phase mixer.
Figure 15:
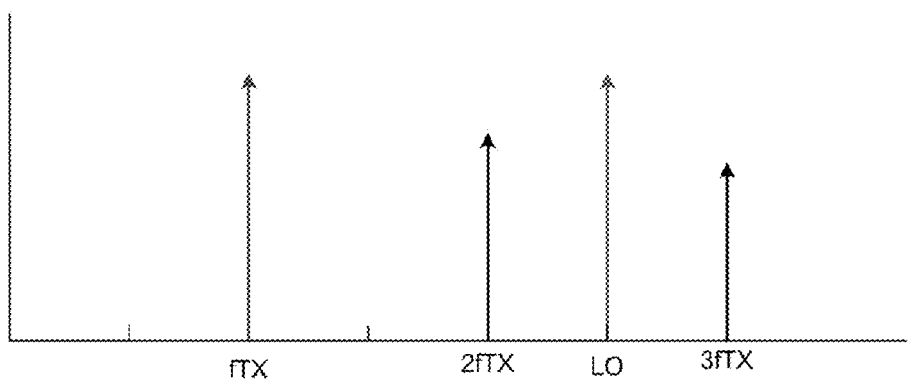
FIG. 15 is a diagram illustrating relationships between transmit signal and local oscillator signal frequencies for five phases.
Figure 16:
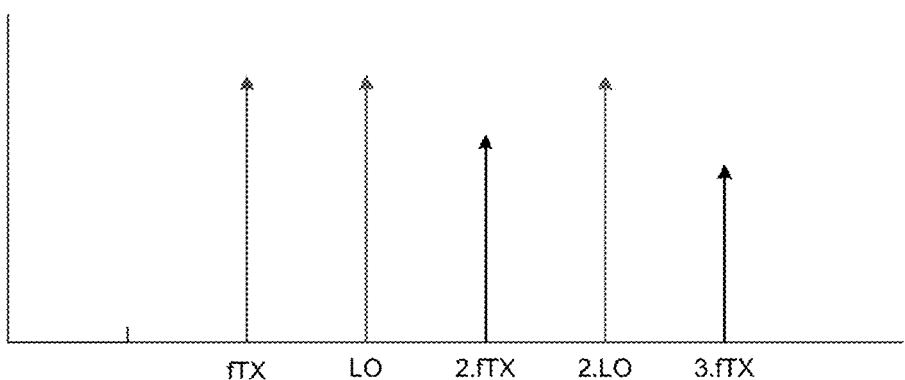
FIG. 16 is a diagram illustrating relationships between transmit signal and local oscillator signal frequencies for three phases.

The multi-phase mixing approach described herein can also be applied to transmitter up-converters in order to generate a transmit frequency with an indirect harmonic relation to the LO frequency. An embodiment of a transmitter up-converter 1400 is illustrated in FIG. 14, in which up to 5 local oscillator phases can be generated, according to the configuration of the converter module 1402 and the local oscillator signals provided to each of the mixer modules $1403_{1-5}$. This arrangement avoids the spectral purity problems that may arise from an unwanted coupling of a transmit signal back into an LO generation tank circuit. FIGS. 15 and 16 illustrate this principle in the cases where $F_{TX}=F_{LO}\times 2/5$ and $F_{TX}=F_{LO}\times 2/3$ respectively.

The transmitter modulator of FIG. 14 is effectively functionally the inverse of the receiver circuit of FIG. 11. The configuration of the vector conversion module 1402 is consequently the inverse of the module 1105 of FIG. 11. The transmit frequency will be 2/Nphase times the LO frequency, with Nphase depending on the chosen constellation, e.g. equal to 3, 4, 5, .... The 2/4 relation is however of no interest as this would not overcome the unwanted coupling mentioned above.

FIGS. 15 and 16 illustrate the relationships between the transmitter frequency fTX and the local oscillator frequency LO, where FTX=FLO×2/5 (for 5 phases), shown in FIG. 15, and for FTX=FLO×2/3 (for 3 phases), shown in FIG. 16.

Figure 17:
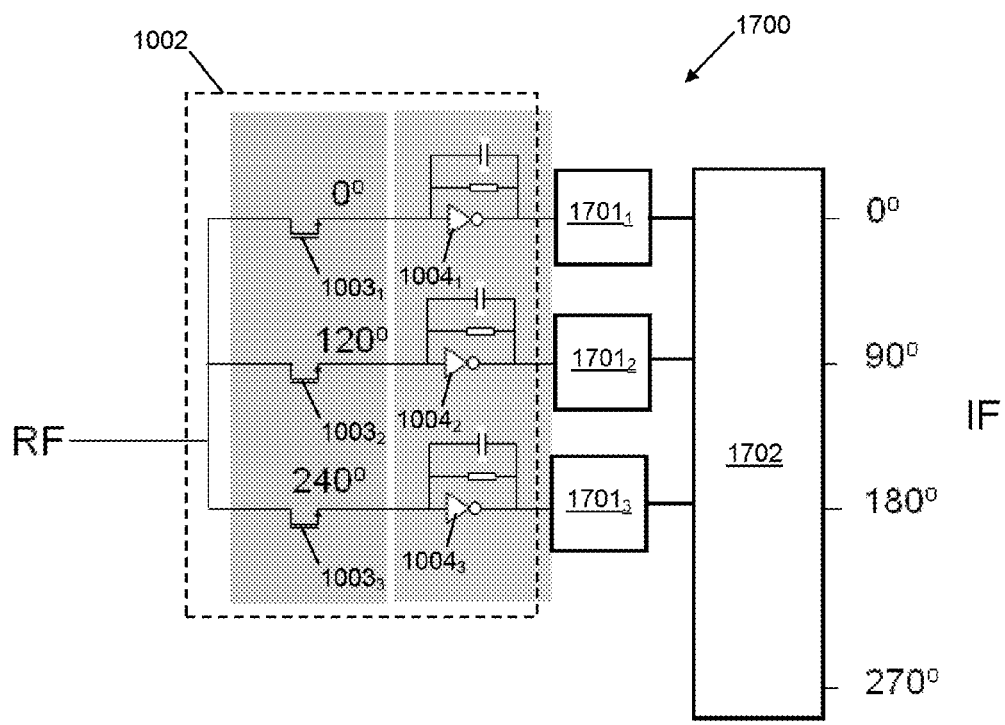
FIG. 17 is a schematic circuit diagram of an alternative exemplary RF down-converter combining a three phase mixer with a balanced quadrature (four phase) IF output.

It is also possible to sample, using Analogue to Digital Converters (ADCs), the multi-phase output signals of the mixer 1002, 1102 and perform the weighted summing in the digital domain in place of the analogue summing performed by the summing modules 1005, 1105 in the embodiments of FIGS. 10 and 11. This alternative is illustrated in the down-converter 1700 of FIG. 17, in which output signals from the mixer 1002, corresponding to the mixer 1002 of the down-converter in FIG. 10, are provided to ADCs $1701_{1-3}$. Digital output signals from the ADCs $1701_{1-3}$ are provided to a digital summing module 1702, which provides the output balanced quadrature IF signal.

In combination with digital I/Q error correction algorithms, the weighted recombining towards quadrature signals is much less critical with respect to quadrature amplitude and phase accuracy using a digital weighting module. Systematic errors can also be more easily corrected in the digital domain.

Figure 18:
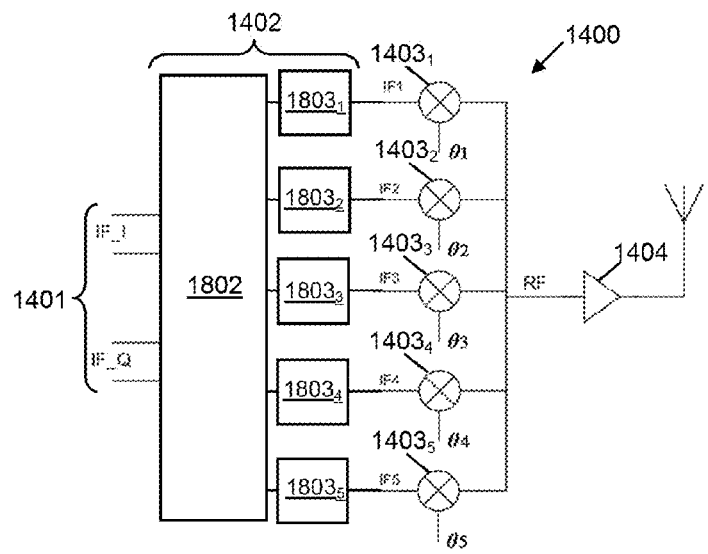
FIG. 18 is a schematic circuit diagram of an alternative exemplary RF up-converter in which a balanced quadrature signal is converted into a five phase IF signal.

As with the vector conversion module 1002, 1102 of FIGS. 10 and 11 described above, the function of the converter module 1402 can be implemented either in the digital or analogue domain. When the vector conversion is implemented digitally, DACs (digital to analogue converters) $1803_{1-5}$ are used at the outputs of the digital conversion module 1802 to convert the IF signals from digital into analog signals, as illustrated in FIG. 18. The components are otherwise similar to those shown in FIG. 14 and described above.

Other embodiments are intentionally within the scope of the invention as defined by the appended claims.

The invention claimed is:
1. A radiofrequency (RF) apparatus comprising:
an RF signal input or output;
a mixing module comprising a first plurality of Intermediate Frequency (IF) amplifiers, wherein at least one IF amplifier is coupled to the RF signal input or output via a first switch and a first plurality of input or output signals to or from the first plurality of IF amplifiers are not in quadrature;

a multi-phase local oscillator signal generator configured to provide a reconfigurable switching signal phase to said first switch; and a vector conversion module configured to transmit or receive the first plurality of input or output signals and receive or provide a second plurality of input or output IF signals to or from a weighted sum of the first plurality of IF amplifier input or output signals, wherein at least one of the second plurality of the input or output IF signals is different from the first plurality of the IF amplifier input or output signals; and wherein the vector conversion module further comprises: a summing amplifier for at least one of the second plurality of input or output IF signals, the summing amplifier connected to at least one of the IF amplifiers via a weighted resistor network.

2. The RF apparatus of claim 1, wherein the weighted resistor network further comprises: a parallel network of switchable resistors comprising a plurality of resistors connected to a respective IF amplifier via a second switch.

3. The RF apparatus of claim 1 wherein the vector conversion module further comprises:

a plurality of analog to digital converters configured to receive the output signals from or transmit the input signals to the first plurality of IF amplifiers; and a digital summing module configured to receive or provide the second plurality of IF signals to or from the plurality of analog to or from digital converters.

4. The RF apparatus of claim 1 wherein the vector conversion module is configured to receive or provide a quadrature IF signal.

5. The RF apparatus of claim 1, wherein the second plurality of the output IF signals is greater than the first plurality of the IF amplifiers.

6. The RF apparatus of claim 1, wherein the mixing module is reconfigurable.

7. The RF apparatus of claim 6, wherein the mixing module is further reconfigurable to receive or generate IF signals at three, four, or five phases.

8. The RF apparatus of claim 1, further comprising a local oscillator signal which has five phases.

9. The RF apparatus of claim 1, wherein the multi-phase local oscillator signal generator further comprises:

a multiplexer tree; and a shift register.

10. The RF apparatus of claim 9, wherein the multiplexer tree is an eight-to-one multiplexer tree.

11. The RF apparatus of claim 9, wherein the shift register is a five-plus-one shift register.

12. The RF apparatus of claim 1, wherein the RF apparatus is either an RF receiver or an RF transmitter.

* * * * *